United States Patent [19]

Rhebergen

[11] Patent Number: 5,479,456
[45] Date of Patent: Dec. 26, 1995

[54] AUTOMATIC FALSE SYNCHRONIZATION CORRECTION MECHANISM FOR BIPHASE-MODULATED SIGNAL RECEPTION

[75] Inventor: Gertjan Rhebergen, Hilversum, Netherlands

[73] Assignee: U.S. Philips Corporation, New York, N.Y.

[21] Appl. No.: 245,391

[22] Filed: May 18, 1994

[30] Foreign Application Priority Data

May 19, 1993 [EP] European Pat. Off. ............. 93201446

[51] Int. Cl.⁶ ................................................ H04L 7/02
[52] U.S. Cl. ........................................ 375/361; 375/375
[58] Field of Search ................................. 375/108, 110,
375/118, 119, 120, 355, 359, 360, 361,
375, 373, 371, 374, 376; 307/600, 601,
510, 517, 523, 590; 328/62, 72, 109, 139,
150, 151; 327/141, 147, 151

[56] References Cited

U.S. PATENT DOCUMENTS

| | | | |
|---|---|---|---|
| 3,764,903 | 10/1973 | Griswold | 324/76.82 |
| 4,376,309 | 3/1983 | Fenderson et al. | 375/110 |
| 4,709,378 | 11/1987 | Wouda et al. | 375/110 |
| 4,787,097 | 11/1988 | Rizzo | 375/120 |
| 4,812,783 | 3/1989 | Honjo et al. | 348/537 |
| 5,243,630 | 9/1993 | Rhebergen | 375/361 |

FOREIGN PATENT DOCUMENTS

| | | | |
|---|---|---|---|
| 0162505 | 11/1985 | European Pat. Off. | H04L 7/02 |
| 2094110 | 9/1982 | United Kingdom | H04B 3/46 |

Primary Examiner—Stephen Chin
Assistant Examiner—Tesfaldet Bocure
Attorney, Agent, or Firm—David R. Treacy

[57] ABSTRACT

An arrangement comprising a controllable clock signal source (1), a decision circuit (8) for determining the polarity of a received biphase signal at two successive sampling instants in a single symbol interval, and a phase detector (35) with a first comparator (16) to compare the polarity samples at the two sampling instants with each other. The phase detector generates a control signal for adjusting the frequency and phase of the adjustable clock signal source (1) in response to the output signal of the first comparator. A second comparator (28) compares polarity samples at the same relative sampling instant in two successive sampling instants with each other. The second comparator (28) inhibits phase detector (35) in response to the output signal of this second detector. In the case of false synchronization, the output of phase detector (35) will continue to present the same signal value, so that automatically an adjustment is made of the instant of correct synchronization. This adjustment is carried out by a VCO (3) and/or phase shifter means (12).

7 Claims, 4 Drawing Sheets

AUTOMATIC FALSE SYNCHRONIZATION CORRECTION MECHANISM FOR BIPHASE-MODULATED SIGNAL RECEPTION

BACKGROUND OF THE INVENTION

The invention relates to an arrangement for generating a clock signal from a received biphase-modulated signal, comprising a controllable clock signal source, a decision arrangement for sampling the polarity of the received biphase signal at a first sampling instant and at a second sampling instant in a symbol interval, the sampling instants having a fixed time spacing, a first comparator for comparing the polarity samples at the first and at the second sampling instants in the symbol interval with each other, a phase detector having an output for supplying, in response to the output signal of the first comparator, a control signal for controlling the frequency and phase of the clock signal source, and a second comparator for comparing the polarity samples at the same relative sampling instants in two successive symbol intervals with each other.

Such arrangements may find their application in receiving devices for digital signals which are used, for example, in subscriber sets of digital telephone systems.

Such an arrangement is known from Dutch Patent Application 8 401 310 to, which U.S. Pat. No. 4,709,378 corresponds. The two sampling instants, for example, instants tB and tF, are derived from the local controllable clock signal source and are to be synchronized with the received biphase-modulated signal.

The sampling instants are a fixed time interval apart. In said arrangement they are approximately one-third to one-fourth symbol interval apart. There is mention of a state of synchronization when the second sampling instant tF occurs just in the middle of the symbol interval where the biphase signal has a zero crossing. The symbol values at the first instant tB represent the transferred information. To reach this condition of correct synchronization, the sampling instants are shifted relative to the received biphase signal until the sampling instant tF occurs just in the middle of a symbol interval. This shift is realized by applying the generated control signal to the controllable clock signal source which comprises a voltage-controlled oscillator frequency (VCO). The oscillator is slightly reduced or increased depending on the control signal.

It is also possible to have a state of so-called "false" synchronization, which occurs on the boundary between two successive symbol intervals. This state is detected by a 64-counter connected to the output of the second comparator. If the same signal value is detected 64 times in a row, the output of the 64-counter produces a signal to indicate the state of false synchronization.

Said method is data-dependent, however, because if the received signal has the same symbol value for more than 64 symbol intervals in a row, an indication signal of false synchronization is produced erroneously. Such a counter further takes up space.

SUMMARY OF THE INVENTION

It is an object of the invention to provide an arrangement for generating a clock signal from a received biphase-modulated signal in which false synchronization can be detected independent of the valves of the data.

The arrangement according to the invention is characterized in that the second comparator is coupled to the phase detector for inhibiting the phase detector in response to the output signal of the second comparator.

The recognition of the invention is based on the fact that the second sampling instant tF, alternatively termed phase decision instant, is too early or too late in principle. In the case of false synchronization the signal values at the sampling instants tB and tF and in successive symbol intervals are related to each other. In addition, in the case where the sampling instant tF is too early, a different relation is valid from the case where the sampling instant tF is too late. In both cases there is a correction mechanism present utilizing the relations for controlling the clock signal source continuously in the same direction until tF is again in the middle of the symbol interval. If the sampling instant tF is too early in the case of false synchronization, the sampling instants tB and tF are situated just before the boundary of two successive symbol intervals. The relation then holds that the polarity of the signal values at the sampling instants tB and tF in the same symbol interval is the same. Since the sampling instants tB and tF are situated in a single symbol interval, the probability, that the sampled polarity of the received biphase signal at the first sampling instant tB in this symbol interval and in the next symbol interval is the same, is as large as the probability that it is not the same. In one case (a) the phase detector is inhibited by the signal value coming from the second comparator, and in the other case (b) the output signal of the first comparator is produced via the phase detector and causes a delay in the clock signal.

If the sampling instant tF is too late in the case of false synchronization, the sampling instant tB lies before the boundary and tF after the boundary of two successive symbol intervals. In that case the following relations are valid:

(c) if the polarity of the signal values at the sampling instants tB and tF is the same, the polarity of the signal value at the sampling instant tB will not be to same as that at the sampling instant tB in the next symbol interval;

(d) if the polarity of the signal values at the sampling instants tB and tF is not the same, the polarity of the signal value at sampling instant tB will be the same as that in the next symbol interval.

The probability that the sampled polarity of the received biphase signal is the same at the two sampling instants tB and tF in the case of false synchronization, with a late sampling instant tF is as large as the probability that it is not the same. In case (c) the output signal of the first comparator is produced by the phase detector, and delays the clock signal; and case (d) the phase detector is inhibited via the signal value coming from the second comparator, so that the clock is not affected.

The control signal in either case (b) or (c) coming from the phase detector delays the clock signal source, so that the sampling instant tF is delayed. In this manner the sampling instant tF is delayed repeatedly until tF lies substantially in the middle of the symbol interval and thus the state of correct synchronization is obtained.

The arrangement thus comprises an automatic correction mechanism to eliminate false synchronization. The advantage is that no counter is necessary for the data-dependent detection of false synchronization, which also saves space and cost.

The arrangement according to the invention is further characterized in that the second comparator is connected to the phase shifter means for inhibiting the phase shifter means in response to the output signal of the second comparator.

The phase shifter means shift the output signal of the clock signal source towards the middle of the symbol interval once there has been detected that the sampling instant tF has moved away from the middle. By shifting the sampling instant in discrete steps in lieu of said analog control of the control signal, a rapid correction towards the correct synchronization can be effected. In addition, the phase shifter means have a similar correction mechanism to the one described above to reach the state of correct synchronization from the state of false synchronization.

The output of the second comparator is coupled to the phase shifter means to avoid phase shift of the signal in the case where the biphase signal has the same value at sampling instant tB in two successive symbol intervals. In that case, if high-capacity cables are used, the intermediate signal value at sampling instant tF is unreliable. If this situation occurs, the output signal of the second comparator inhibits both the phase detector and the phase shifter means.

The invention will be explained with reference to the following drawing.

DESCRIPTION OF THE PREFERRED EMBODIMENT

Figure 1:
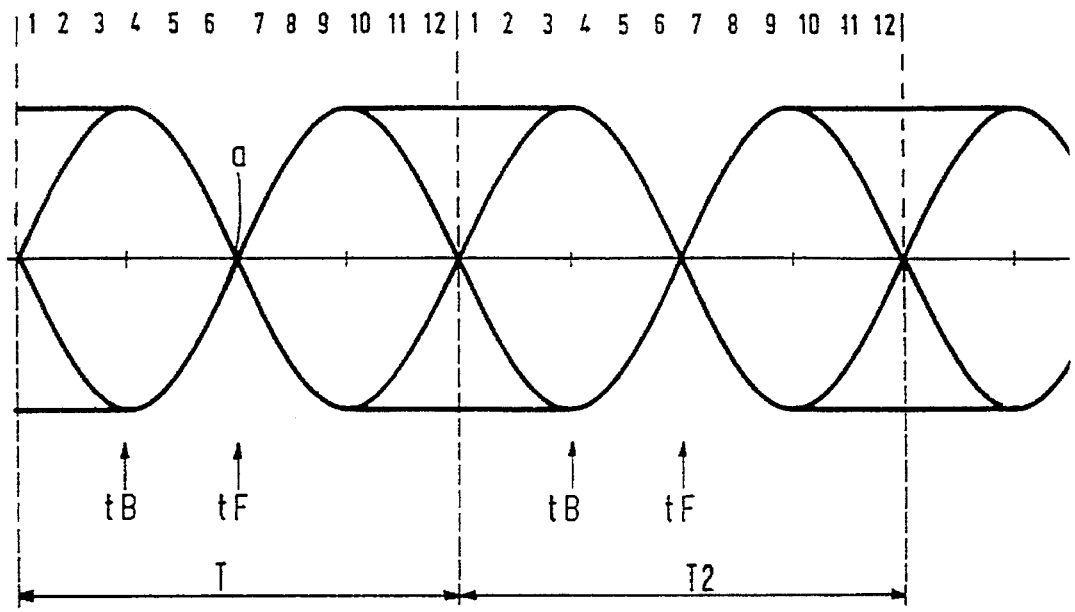
FIG. 1 shows the characteristic eye pattern of a biphase-modulated signal on the output of a Nyquist-I filter.

In FIG. 1 tB and tF represent two sampling instants each in the symbol intervals T and T2 with a spacing in time of T/4. In practice it appears that the spacing may be varied from about T/3 to about T/4. The instants TB and tF are derived from a local clock signal source and are to be synchronized with the received waveform, so that tF coincides with the zero crossing a of the characteristic eye pattern as shown in FIG. 1. Before this state of synchronization is obtained, the instants tB and tF may shift relative to the received waveform.

Figure 2:
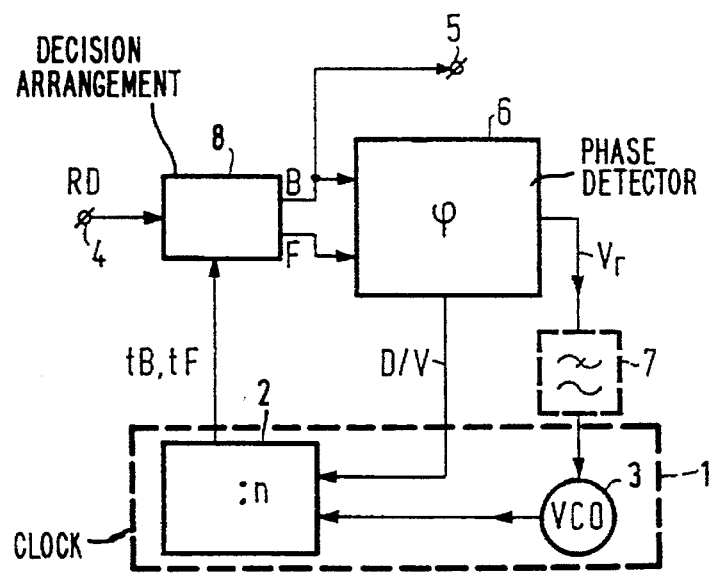
FIG. 2 shows a block diagram of a receiver of biphase-modulated signals (state of the art)

The controllable clock signal source 1 shown in FIG. 2 comprises a series combination of a voltage-controlled oscillator 3 and an adjustable divider 2.

In the block diagram shown in FIG. 2 a voltage-controlled oscillator (VCO) 3 applies a signal to an adjustable divider 2 from which the sampling instants tB and tF are derived. Decision arrangement 8 decides at instants tB and tF whether the instantaneous signal level on signal input 4 for the received biphase-coded signal is greater or smaller than zero volts. The polarity sample is stored as a digital signal B for the sampling instant tB and as a digital signal F for the sampling instant tF, the "positive" decision being stored as a "1" and the "negative" decision being stored as a "0". In a synchronized state the digital signal B on output 5 denotes the value of the transferred information in each symbol interval.

The phase detector 6 derives information about the position of the sampling instants tB and tF relative to the received biphase-coded signal from the combination of signals B and F. If tF (FIG. 1) occurs just before the zero crossing a, signals B and F will be the same (both "1" or both "0"). If tF occurs just after the zero crossing a, signals B and F will not be the same. By a modulo-2 addition of the signals B and F in each symbol interval, a control voltage Vr can be obtained which, when filtered by a filter 7, if any, may be used for adjusting the frequency and phase of the VCO 3.

The VCO is to be stabilized as regards the frequency and phase by the control signal Vr, so that tF lies on the boundary between the sub-intervals 6 and 7. The sampling instant tB is then in the part of the characteristic eye pattern (FIG. 1) that is suitable for establishing the information transferred in the symbol interval.

If tF lies on the boundary of the symbol sub-intervals 12 and 1 between intervals T and T2, a situation occurs which is comparable to the situation on the boundary of the sub-intervals 6 and 7; the control signal Vr then shows in either case a transition from a low level to a higher level. If the digital value for intervals T and T2 is the same, so that the biphase signal has a zero crossing at that point, it is possible in that case for the sampling instant tF of the VCO 3 to be stabilized at the transition between sub-intervals 12 and 1 by the control signal Vr. Measures inhibiting a stabilization at the latter transition will be described hereinafter with reference to the following detailed embodiment.

Figure 3:
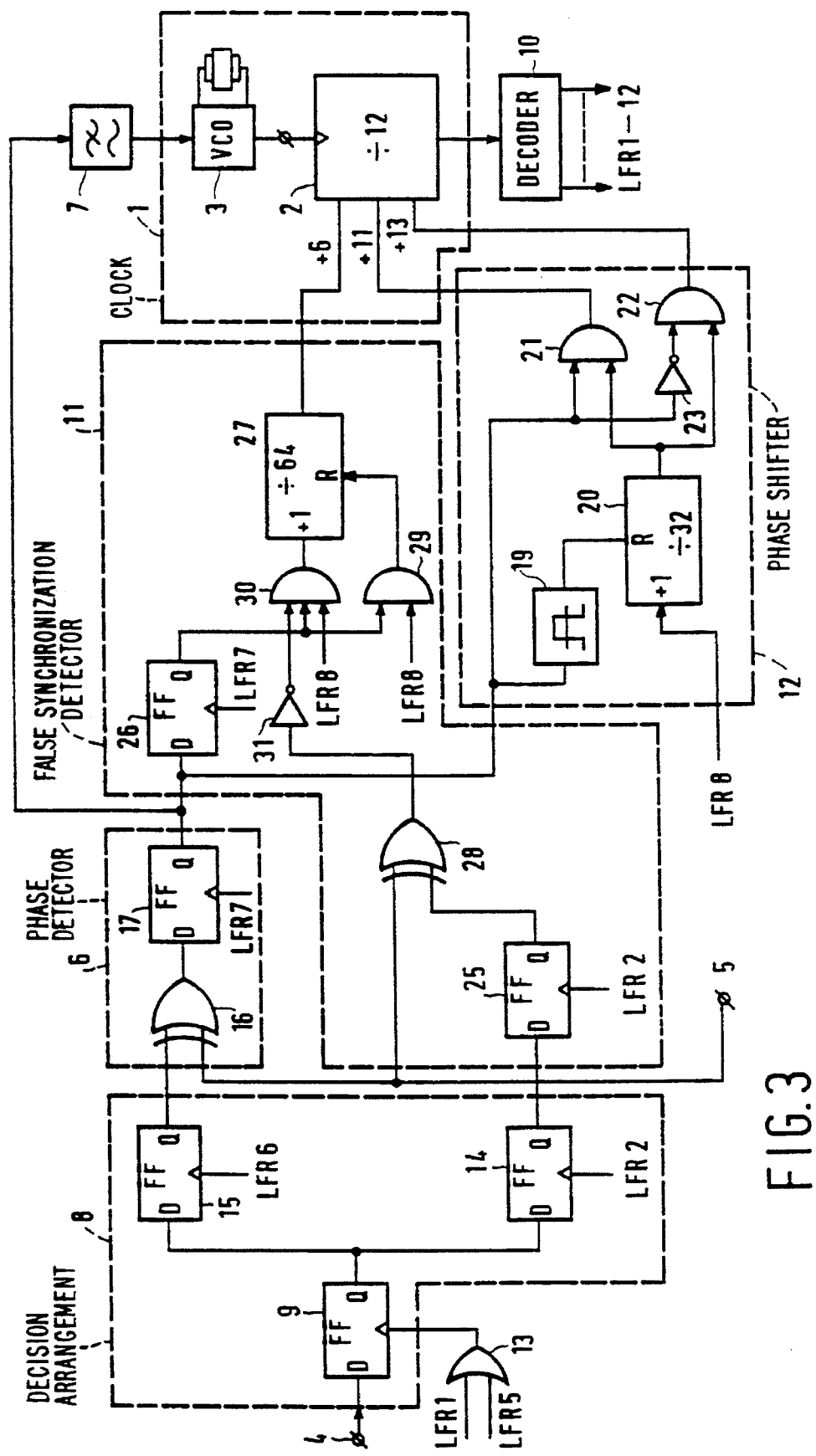
FIG. 3 shows a detailed block diagram of a prior-art arrangement.

In the prior art circuit of FIG. 3 the received filtered biphase-coded signal is applied to input 4 and from there to the decision arrangement 8. The decision arrangement 8 comprises a decision circuit 9 having an input 4 and an output, and two flip-flops 14 and 15 for producing the signals B and F. Each flip-flop 14 and 15 has an input which is connected to the output of the decision circuit 9.

A decoding circuit 10, connected to the programmable counter 2, which is driven by the voltage-controlled oscillator 3, produces twelve mutually phase-shifted clock signals LFR1 ... LFR12 in each symbol interval.

The clock signals LFR1 and LFR5 which determine the respective sampling instants tB and tF are applied to the decision circuit through an OR-gate 13. The two flip-flops 14 and 15 are triggered through their clock inputs by the respective clock signals LFR2 and LFR6 during interval T2, so that the signals B(n+1) and F(n+1) respectively, appear on their outputs, where n+1denotes the number of the symbol interval concerned, and n that of the previous one in interval T. The outputs of the flip-flops 14 and 15 are connected to phase detector 6 which comprises a series combination of a comparator 16 and a flip-flop 17, the comparator 16 being arranged as a modulo-2 gate. The signals B and F are combined in the comparator 16 and the result is applied to flip-flop 17 which is triggered by the clock signal LFR7. The output signal BF(n+1) of flip-flop 17 is applied to VCO 1 as a control signal Vr after being filtered in an optional low-pass filter 7.

The output of phase detector 6 is also connected to phase shifter means 12 which comprise transition detector 19, 32-counter 20, AND-gates 21 and 22, and inverter 23. The phase shifter means 12 activate the adjustable divider 2, so that a discrete phase control of the clock signal source 1 is obtained. This is a relatively fast control compared with the analog control by the voltage-controlled oscillator 3. An aspect which is important to the characteristic eye pattern as shown in FIG. 1 is the signal-to-noise ratio which is kept at a sufficiently high level by the 32-counter 20 acting as an integrator.

The transition detector 19 connected to the output of flip-flop 17 produces a pulse at each transition in the series of signals BF and thereby causes the 32-counter 20 to be reset, which counter is driven by the clock signal LFR8. Thus, if the signal BF does not change for at least 32 symbol intervals, counter 20 produces an output pulse and thereby causes the gates 21 and 22 to be activated which are also activated by the signal BF(n+1) and the respective inverted version BF(n+1) thereof (inverter 23).

If the signal BF(n+1) has a high level (is "1"), the cycle of the programmable counter 2, which cycle normally includes 12 clock pulses of the oscillator 12, is non-recurrently reduced to 11 clock pulses; if the signal BF(n+1) has a low level, the cycle is non-recurrently lengthened to 13 clock pulses. The result is a slight shift of the phase of the clock signals on the outputs of the decoding circuit 10, so that the sampling instant tF moves in the direction of the near transition which is to occur in the signal BF(n+1) from a low to a high level.

The latter transition is a transition between the sub-intervals 6 and 7 (FIG. 1), the "desired transition", or the transition between the sub-intervals 12 and 1, the "undesired transition". In the case of stabilization of the sampling instant tF at the transition 6–7, the decoded data appears on output 5 i.e. the output of flip-flop 14.

To avoid or cancel the synchronization of tF at the undesired transition 12–1, a number of additional system components are added which together may be denoted as false synchronization detector 11. This detector comprises, for example, flip-flops 25 and 26, the 64-counter 27 and the comparator 28 which is arranged as a modulo-2 gate.

The signal B(n+1) on the output of flip-flop 14 and the signal B(n) on the output of flip-flop 25 triggered by the clock signal LFR2, are applied to the count input of counter 27 via comparator 28, inverter 31 and AND-gate 30. The signal BF(n+1) on the output of flip-flop 17 is applied to flip-flop 26 which is triggered by a clock signal LFR7. The output of flip-flop 26 is connected to the count input of counter 27 via AND-gate 30 and to the reset input of counter 27 via AND-gate 29. The gates 29 and 30 are both activated by clock signal LFR8.

The operation of the false synchronization detector 11 is based on the recognition that in the cases where the binary signal F(n)≠B(n), which is always the case around the transition 6–7 and sometimes around the transition 12–1, it always holds that in the latter case (false synchronization occurring after a period of same data values) B(n)=B(n+1), irrespective of the data, and that in the former case B(n+1) for random data is as many times equal as unequal to B(n) on average. The signal B(n) and the signal B(n+1) are modulo-2 added in gate 28. The result is that the output signal of gate 28 is a "1" if B(n+1)≠B(n) and a "0" if B(n+1)=B(n).

At an instant determined by the clock signal LFR8, the contents of counter 27 are incremented by unity if B(n+1)=B(n). If, on the other hand, B(n+1)≠B(n), gate 29 resets counter 27. Whenever counter 27 reaches a full count of 32, it applies a reset pulse to the programmable divider 2. This reset pulse causes an inversion to take place of the most significant bit (MSB) of the contents of divider 2, so that there is a shift of phase of the clock signals on the outputs of the decoder 10 of about a one-half period. The result is that the sampling instant tF shifts from near transition 12–1 to near transition 6–7. Then the sampling instant tF is stabilized at the latter transition in the way described by the signal BF(n+1) on the output of flip-flop 17.

THE INVENTION

Figure 4:
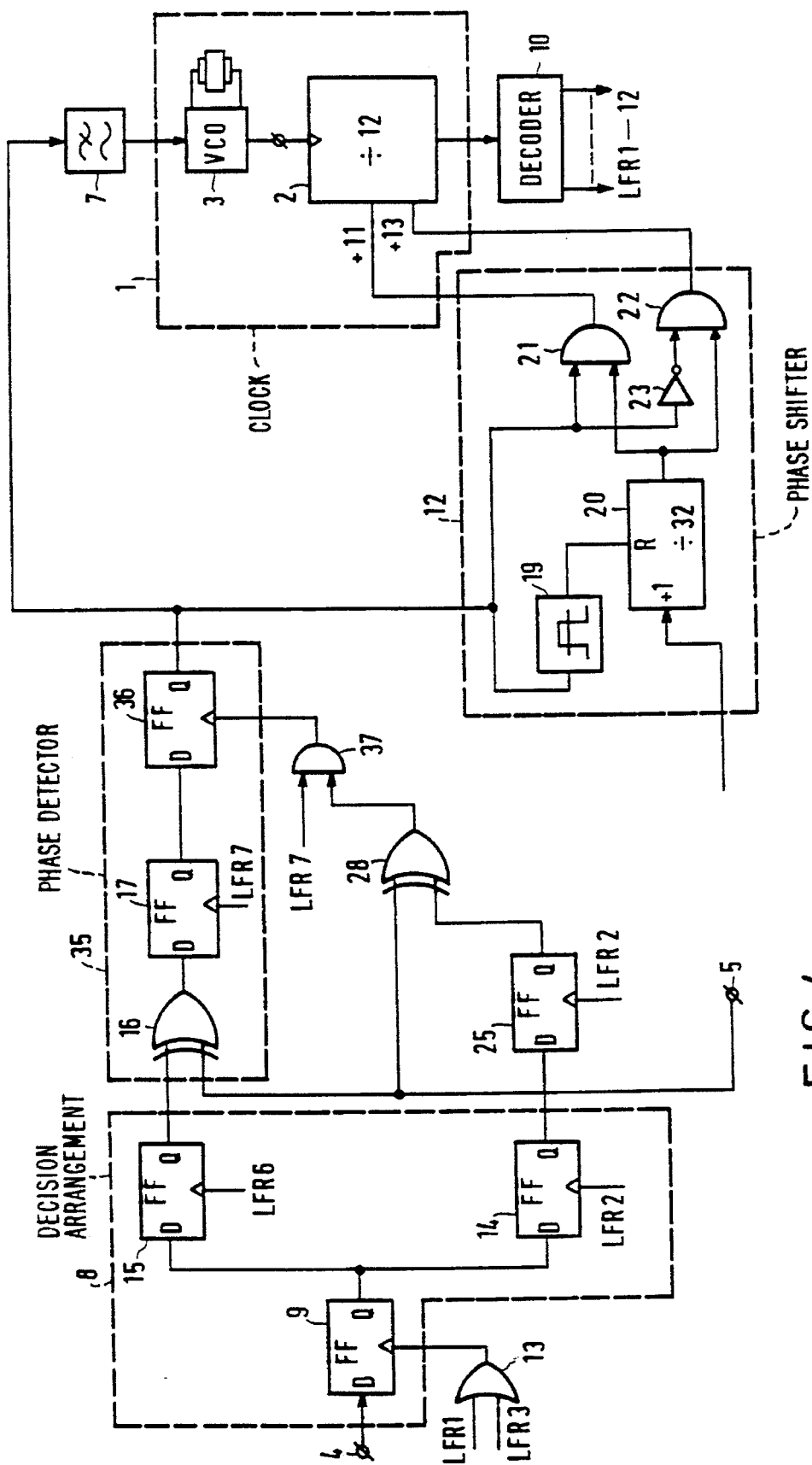
FIG. 4 shows a first detailed block diagram of the arrangement according to the invention.

FIG. 4 shows the block diagram of the arrangement according to the invention. Like elements in FIGS. 3 and 4 are denoted by like symbols. The arrangement according to the invention comprises a decision arrangement 8 combined in series with phase detector 35 for producing the control signal. Phase detector 35 comprises a series combination of comparator 16, flip-flop 17 and flip-flop 36, the output of flip-flop 36, similarly to the output of phase detector 6 in FIG. 3, being connected to the low-pass filter 7 and phase shifter means 12. The output of comparator 28 is connected to the clock input of flip-flop 36 via AND-gate 37. The AND-gate 37 as well as the set input of counter 20 are activated by the clock signal LFR7.

False synchronization occurs on the boundary of two successive symbol intervals; that is, between sub-intervals 12 and 1. As observed hereinbefore, the sampling instant tF will never exactly coincide with this boundary. In the case where the received biphase signal is sampled at sampling instants tB and tF, which occur before said boundary, B(n)=F(n) if the fixed distance in time between the sampling instants tB and tF is ¼ to ⅓ of the symbol interval, as in FIG. 3. The output of comparator 16 then presents the value of "0" which is applied to the input of flip-flop 36 via flip-flop 17. The probability that B(n)=B(n+1) at the sampling instants tB in two successive symbol intervals, is as large as the probability that B(n)≠B(n+1).

If B(n)≠B(n+1), the output of comparator 28 has the signal value "1", so that flip-flop 36 is triggered via its clock input to convey the signal value from its input to its output. The instant at which the clock input is activated is determined by the clock signal LFR7 coming from the decoding circuit 10.

If, however, B(n)=B(n+1), the output of comparator 28 will have the value of "0", so that the clock input of flip-flop 36 does not receive a clock signal. The flip-flop 36 is inhibited in this manner and will not present on its output the signal value it received on its input.

If in the case of false synchronization the sampling instant tF is too early relative to the boundary of the two successive symbol intervals, the output of flip-flop 36 and thus also the output phase detector 35 will produce the control signal having the value of "0" as soon as B(n)≠B(n+1).

This signal value "0" is applied to the voltage-controlled oscillator 3 via the low-pass filter 7, which results in the oscillator running more slowly. The sampling instant tF is postponed as a result, so that the sampling instant tF occurs "too late". This is meant to denote that the sampling instant tF occurs after the boundary of two successive symbol intervals, whereas the sampling instant tB still occurs before the boundary.

In the situation shown above, in which the sampling instant tF occurs "too late", the following relations hold:

1) If B(n)=F(n), B(n)≠B(n+1) will be the result;
2) If B(n)≠F(n), B(n)=B(n+1) will be the result.

In the former case the output of comparator 16 has the value of "0" which is applied to the input of flip-flop 36 via flip-flop 17 in response to clock signal LFR7. In the subsequent symbol interval the signal value "0" is presented on the output of flip-flop 36 in response to clock signal LFR7, because the comparator 28 has the value of "1" due to B(n)≠B(n+1).

In the latter case the output of comparator 16 presents the signal value "1" which is applied to the input of flip-flop 36 in response to clock signal LFR7. Since, however, flip-flop 36 is inhibited in the next symbol interval due to the signal value "0" on the output of comparator 28, the output of flip-flop 36 will produce the unmodified previous signal value "0".

The signal value "0" in said situations leads to the voltage-controlled oscillator 3 being further delayed. This control mechanism leads to a shift towards the correct synchronization instant.

Said control mechanism for controlling from the state of false synchronization to the state of correct synchronization can also be used with the phase shifter means 12. If the sampling instant tF is "too early" or "too late" in the case of false synchronization, the output signal of phase detector 35 will always have the value of "0", as described above. The 32-counter 20 will therefore not receive any reset pulse and be filled with the clock signal LFR3, so that the adjustable divider 2 will divide by 13 owing to the signal value "0" on the output of phase detector 35. As a result, the sampling instant tF will shift in discrete steps until the situation of correct synchronization has been reached. Due to the phase shift in discrete steps the control mechanism including phase shifter means 12 is comparatively fast compared with the control mechanism comprising filter 7 and oscillator 3.

Figure 5:
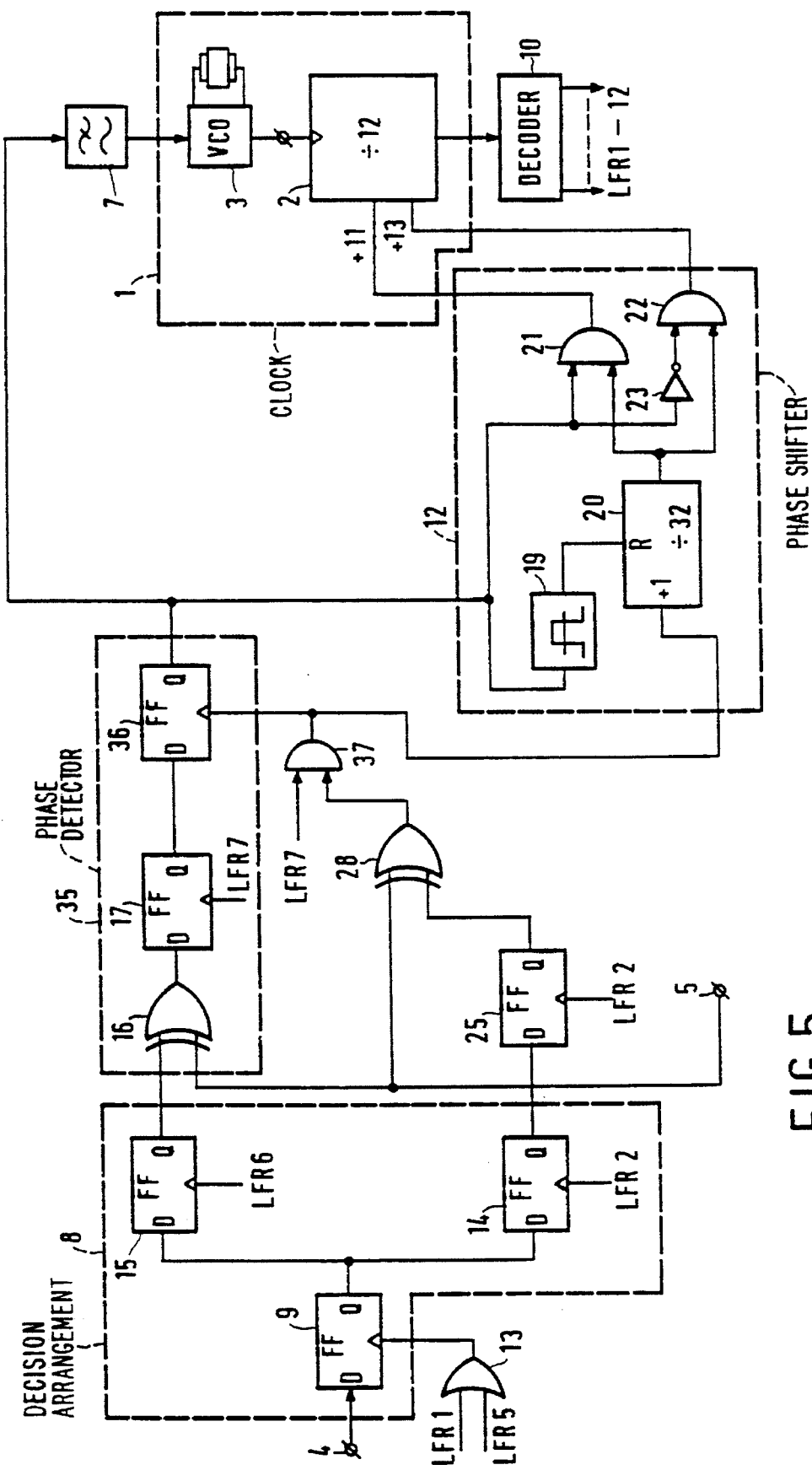
FIG. 5 shows a second detailed clock diagram of the arrangement according to the invention.

The embodiment of the invention shown in FIG. 5 corresponds to that of FIG. 4 except for the fact that in FIG. 5 the output of AND-gate 37 is connected to the count input of 32-counter 20. As a result, the 32-counter 20 will not receive a count pulse if B(n)=B(n+1). This measure is important if high-capacity cables are used. In that case, for that matter, the intermediate phase decision F(n) will be unreliable if B(n)=B(n+1). Stopping the 32-counter 20 avoids erroneous phase shift of the clock signal source 1.

I claim:

1. A circuit for generating a clock signal from a received biphase-modulated signal, comprising:

a controllable clock signal source, a decision arrangement for sampling the polarity of the received biphase signal at a first sampling instant and at a second sampling instant in a symbol interval, the sampling instants having a fixed time spacing, a first comparator for comparing the polarity samples at the first and at the second sampling instant in the symbol interval with each other, a phase detector having an output for supplying, in response to the output signal of the first comparator, a control signal for controlling the frequency and phase of the clock signal source, and a second comparator for comparing the polarity samples at the same relative sampling instant in two successive symbol intervals with each other, said second comparator having an output signal which has a given value when said polarity samples at the same relative sampling instant in two successive symbol intervals are equal to each other, characterized in that the second comparator is coupled to the phase detector for inhibiting the phase detector when the output signal of the second comparator has said given value.

2. A circuit as claimed in claim 1, further comprising a phase shifter for shifting the phase of the clock signal of the clock signal source in discrete steps, wherein the phase shifter is responsive to the output of the phase detector, characterized in that the second comparator is connected to the phase shifter for inhibiting the phase shifter in response to the output signal of the second comparator having said given value.

3. A circuit as claimed in claim 2, wherein the phase shifter comprises a counter, characterized in that the count input of the counter is coupled to the output of the second comparator.

4. A circuit as claimed in claim 1, in which the phase detector comprises a first hold circuit which has an input connected to the output of the first comparator, characterized in that the phase detector comprises a second hold circuit combined in series with the first hold circuit, the second hold circuit has an output forming the output of the phase detector, and the second hold circuit has a clock input coupled to the output of the second comparator.

5. A circuit as claimed in claim 4, characterized in that said first hold circuit and said second hold circuit are each formed by a respective flip-flop.

6. A circuit as claimed in claim 4, further comprising a phase shifter for shifting the phase of the clock signal of the clock signal source in discrete steps, wherein the phase shifter is responsive to the output of the phase detector, characterized in that the second comparator is connected to the phase shifter for inhibiting the phase shifter in response to the output signal of the second comparator having said given value.

7. A circuit as claimed in claim 6, wherein the phase shifter comprises a counter, characterized in that the count input of the counter is coupled to the output of the second comparator.

* * * * *